United States Patent [19]

Gordon

[11] Patent Number: 4,493,090

[45] Date of Patent: Jan. 8, 1985

[54] MEMORY SYSTEM

[75] Inventor: Bruce E. Gordon, Santa Barbara, Calif.

[73] Assignee: Raytheon Company, Lexington, Mass.

[21] Appl. No.: 453,551

[22] Filed: Dec. 27, 1982

[51] Int. Cl.³ .................................................. H04B 13/00
[52] U.S. Cl. ..................... 375/4; 343/18 E; 455/18
[58] Field of Search .............. 375/3, 4, 106, 94; 455/1, 17, 18; 365/45; 364/514; 343/18 E; 328/55, 155

[56] References Cited

U.S. PATENT DOCUMENTS

| | | | |
|---|---|---|---|
| 3,772,596 | 11/1973 | Edwards | 455/18 |
| 3,971,021 | 7/1976 | Cann | 343/18 E |
| 4,135,156 | 1/1979 | Sander, Jr. et al. | 455/18 |
| 4,147,895 | 4/1979 | Fenoglio | 375/3 |
| 4,223,404 | 9/1980 | Lowenschuss | 375/3 |
| 4,267,596 | 5/1981 | Lowenschuss | 375/3 |
| 4,298,987 | 10/1981 | Stattel et al. | 375/106 |
| 4,349,918 | 9/1982 | Gordon | 375/3 |
| 4,380,816 | 4/1983 | Nicholls | 375/3 |

Primary Examiner—Robert L. Griffin
Assistant Examiner—Stephen Chin
Attorney, Agent, or Firm—Richard M. Sharkansky; Joseph D. Pannone

[57] ABSTRACT

A memory system adapted to store samples of a finite portion of a periodic signal and produce an output signal having the same frequency as the periodic signal for a relatively longer time duration. The system includes a network for comparing the initial and terminal portions of the finite portion of the stored signal to determine the relative phase shift therebetween. Portions of the samples of the stored periodic signal and of the phase delayed replicas which extend from the first sample to the next to the last sample thereof are sequentially coupled to an output selectively in accordance with the determined relative phase shift to produce the output signal.

4 Claims, 7 Drawing Figures

MEMORY SYSTEM

BACKGROUND OF THE INVENTION

This invention relates generally to memory systems, and more particularly to memory systems which are adapted to store a periodic signal and produce complete cycles of such stored periodic signal.

As is known in the art, it is sometimes desirable to receive a pulse of radio frequency energy and produce a continuous wave signal having a frequency related to the frequency of the received energy. Such continuous wave signal may, for example, be transmitted as either a continuous wave signal or may be pulse modulated to enable transmission of a train of radio frequency signals. One technique suggested to produce such continuous wave signal has been to store the received signal in a recirculating memory; however, because the phase of the received signal at the start of the pulse relative to the phase of the signal at the end of the pulse is generally not known because the frequency of the signal is not known, a phase discontinuity distorts the continuous wave signal being produced and thereby reduces the effectiveness of the system. In another technique this phase discontinuity problem is solved by producing control signals indicating the start of each cycle of the received signal. Such technique is described in U.S. Pat. No. 4,223,404, "Apparatus For Recycling Complete Cycles of a Stored Periodic Signal," issued Sept. 16, 1980 to Oscar Lowenschuss and assigned to the same assignee as the present invention. Such system stores either a slice of, or the complete radio frequency pulse, and then recycles complete cycles of the stored signal. While such system is useful in many applications, in other applications it is desirable to recycle complete cycles of a received pulse prior to the termination of either an arbitrary pulse slice thereof or the received pulse itself.

SUMMARY OF THE INVENTION

In accordance with the present invention, apparatus for storing a periodic signal and for recycling portions of such stored periodic signal is provided, such apparatus comprising: Means for storing first and last samples of a recorded segment of the periodic signal; means, responsive to the stored first and last samples, for producing a control signal indicative of the difference between the first and last sample; storage means; and means, responsive to the control signal, for cyclically storing in the storage means a fixed portion of the recorded segment, each succeeding portion being stored with a phase shift related to the difference between the stored first and last samples.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENT

Figure 1:
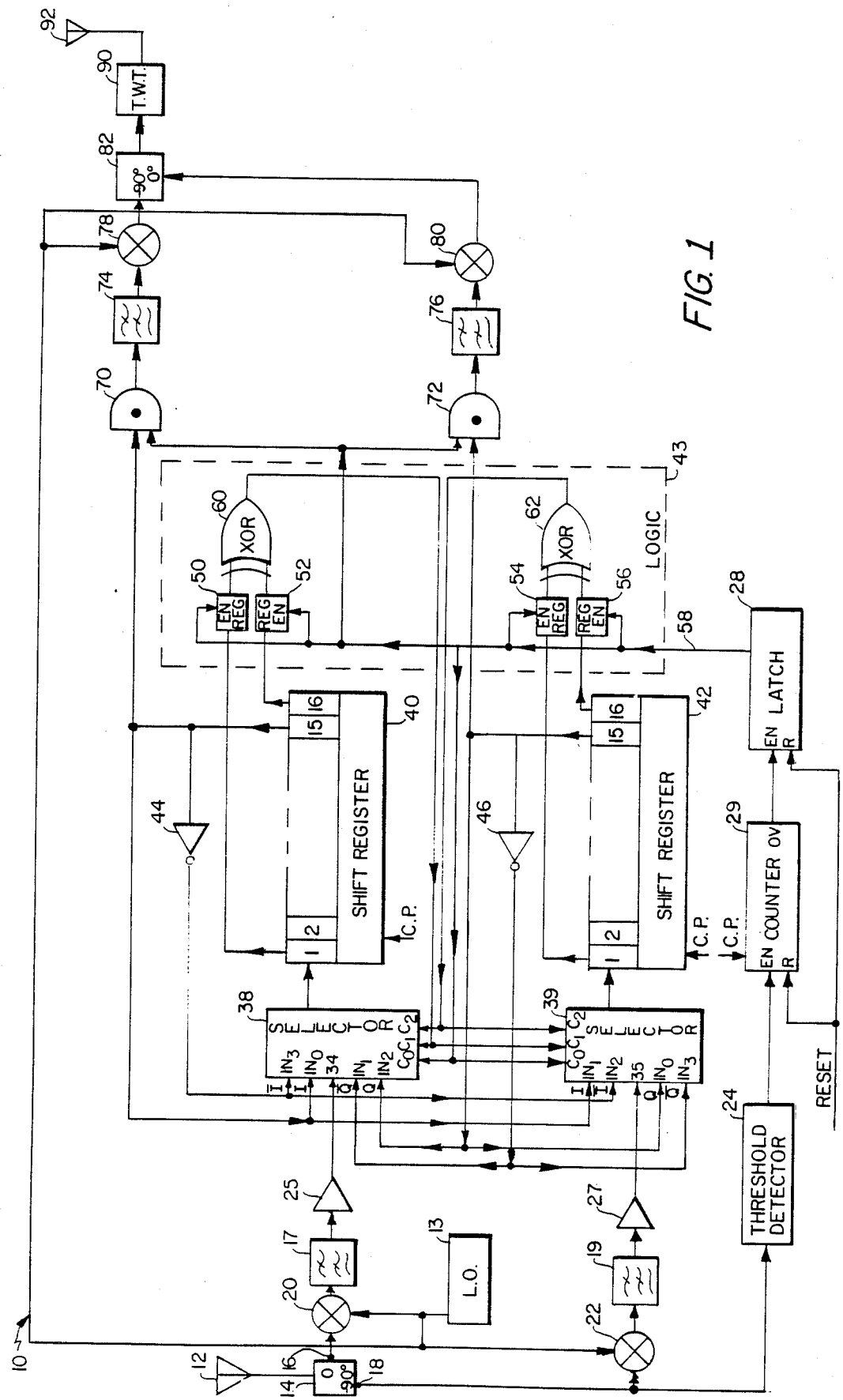
FIG. 1 is a block diagram of a memory system according to the invention.

Referring now to FIG. 1, a memory system 10 is shown adapted to receive pulses of radio frequency energy and to transmit a continuous wave radio frequency signal having the same frequency as the frequency of the received radio frequency pulse. Such system 10 includes a radio frequency antenna 12 for receiving the pulses of the radio frequency signal. The radio frequency signal received by antenna 12 is here separated into a pair of quadrature signal channels. More particularly, the received radio frequency signal is fed to a quadrature hybrid 14 having an "in phase" output port 16 and a "quadrature" output port ($-90°$) 18, as shown. A portion of the radio frequency signal produced at the output of quadrature port 18 is fed to a threshold detector 24. In response to a detected radio frequency energy pulse, detector 24 produces a signal which is fed to the enable (EN) terminal of a conventional counter 29, here a 16-bit counter, which, when enabled by the enable signal fed to the enable terminal, increments its initially reset contents by 1 in response to each clock pulse (c.p.) fed thereto. When sixteen clock pulses have been counted by the counter 29 a "high" or logical 1 signal is produced at the overflow output (OV) of such counter 29 to change the logic state of the output of the latch 28 from an initial (or reset) logical 0 state to a logical 1 state.

Figure 2A:
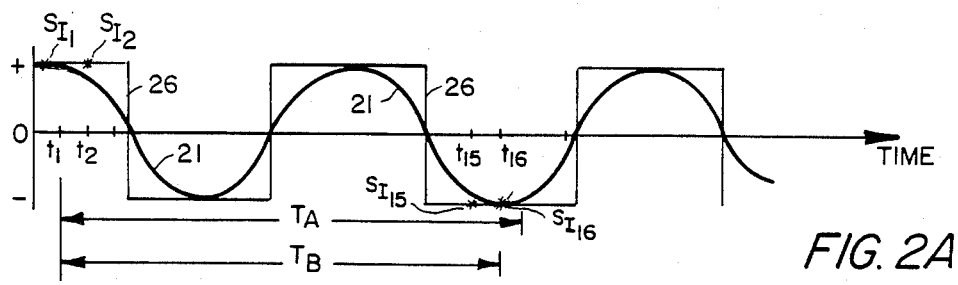
FIGS. 2A-2F are diagrams useful in understanding the invention.
Figure 2B:
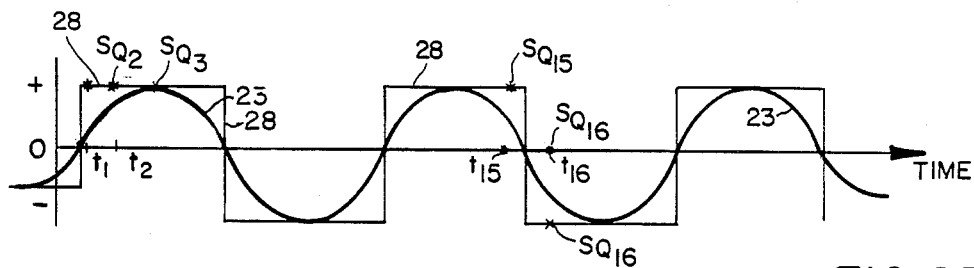
Figure 2C:
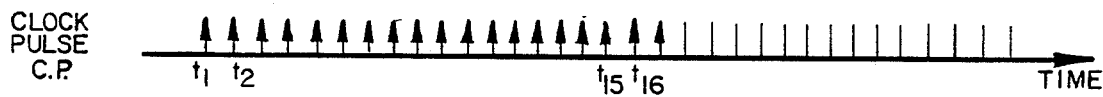

The in-phase output port 16 and quadrature output port 18 are fed to a pair of mixers 20, 22, as shown. A local oscillator signal produced by a local oscillator 13 is also fed to the pair of mixers 20, 22, as shown, to heterodyne the local oscillator signal with the received radio frequency signal and thereby translate the frequency of the received radio frequency signal to a suitable intermediate frequency. Here the local oscillator signal has a frequency at the center of the operating bandwidth (here a 10 MHz bandwidth) of the system so that the intermediate frequency signal here has frequency from 0 to 5 MHz. It is also noted that the intermediate frequency signal produced at the output of mixer 20 is delayed in phase 90° with respect to the phase of the intermediate frequency produced by mixer 22. The intermediate frequency signals produced by mixers 20, 22, after passing through low pass filters 17, 19 (here having bandpass frequencies of 0 to 5 MHz), are shown as sinusoidal signals 21, 23 in FIGS. 2A and 2B, respectively. As will be described in detail hereinafter, a plurality of one bit quantized samples, here 16 samples, are taken of the intermediate frequency signals at regularly spaced times $t_1$ to $t_{16}$ in response to clock pulses CP shown in FIG. 2C. More particularly, the intermediate frequency signals produced by low pass filters 17, 19 are fed to limiters 25, 27, respectively, as shown in FIG. 1. The limiters 25, 27 convert the sinusoidal signals 21, 23 into a train of pulses 26, 28 (FIGS. 2A, 2B), respectively. Here, a "high" or logical 1 state is produced when the sinusoidal signals 21, 23 are of positive polarity and a "low" or logical 0 state is produced when such sinusoidal signals are of a negative polarity, as shown. As will be described in detail, hereinafter, the signals produced at the outputs of limiters 25, 27 pass through selectors 38, 39, respectively, to the inputs of the first stages of shift registers 40, 42, respectively. Samples of the limited signals (i.e. one bit samples of the sinusoidal signals 21, 23) are stored in the shift registers 40, 42 in response to clock pulses fed thereto on line c.p. until 16 of such samples are stored in each one of the shift registers 40, 42. The one-bit samples are taken at a sampling rate which is independent of the frequency of the intermediate frequency signal;

however, for unambiguous operation at least two samples per cycle of the intermediate frequency signal are taken. Thus, here the sampling rate (i.e. the clock pulse rate) is greater than 10 MHz. As will also be described in detail hereinafter, while the segment of the signals 26, 28 being sampled is from a time $t_1$ to a time $t_{16}$ (a segment having time period $T_A$), the system 10 uses only a portion of the segment, here a segment one sample less than the stored samples in the recirculation process; that is, the system 10 here uses in the recirculation process a segment which extends in time duration $t_1$ to $t_{15}$ (a segment having a time period $T_B$). The recycling process moves a sample taken of time $t_1$ of one signal segment to a time coincident with a sample at time $t_{16}$ of the preceding segment. It is noted that if the segment is to be recycled without any phase discontinuity, the signal in the time interval between $t_1$ and $t_2$ would match the signal in the time interval between $t_{15}$ and $t_{16}$. In the sampled data stream these two signals are one sampling interval long, so the sample $S_{I1}$ of the in-phase intermediate frequency signal 26 taken at time $t_1$ would be equal to the sample $S_{I16}$ of such signal 26 taken at time $t_{16}$, and the sample $S_{Q1}$ of the quadrature signal 28 taken at time $t_1$ would be equal to the sample $S_{Q16}$ taken at time $t_{16}$. To put it another way, the signal samples $S_{I16}$, $S_{Q16}$ taken one sample after the segments used in the recirculation (i.e., the segment having a time period $T_B$) represent the best estimate of what the initial signal value in the recirculated segment should be in order to minimize the phase discontinuity upon recirculation. Thus, the beginning and ending samples $S_{I1}$, $S_{I16}$ and $S_{Q1}$, $S_{Q16}$ of the stored segment $T_A$ are compared to each other to determine the proper phase step to be taken in recycling the segment $T_B$, i.e., the phase step in "connecting" the last sample in the segment $T_B$ (i.e., $S_{I15}$, $S_{Q15}$), to the first sample in the segment (i.e., $S_{I1}$, $S_{Q1}$). If the first sample $S_{I1}$ is equal to last sample $S_{I16}$ in the in-phase channel and the first sample $S_{Q1}$ is equal to the last sample $S_{Q16}$ in the quadrature channel, as in the example shown in FIGS. 2A and 2B, no phase shift is introduced in the recycle process and sample $S_{I1}$ follows sequentially sample $S_{I15}$ while sample $S_{Q1}$ follows sequentially sample $S_{Q15}$. If sample $S_{I1}$ does not equal sample $S_{I16}$ but sample $S_{Q1}$ is equal to sample $Q_{16}$, a 90° phase shift is required in the recycling process. If sample $S_{I1}$ is equal to sample $S_{I16}$ but sample $S_{Q1}$ is not equal to sample $S_{Q16}$, a 270° phase shift is required in the recycling process. Lastly, if sample $S_{I1}$ is not equal to sample $S_{Q16}$ and sample $S_{Q1}$ is not equal to sample $S_{Q16}$, a 180° phase shift is required in the recycling process. To put it another way, if the segment of samples $S_{I1}$ to $S_{I15}$ is designated by a phasor $S\angle 0°$, the segment of samples $S_{Q1}$ to $S_{Q15}$ may be dissipated as a phasor $S\angle -90°$. Further, a phasor which may be represented as $S\angle -180°$ may be produced by feeding phasor $S\angle 0°$ through an inverter and a phasor $S\angle -270°$ may be produced by passing phasor $S\angle -90°$ through an inverter. Thus, where no phase shift is required phasor $S\angle 0°$ recycles in the in-phase channel and phasor $S\angle -90°$ recycles in the quadrature channel. To provide the required 180° phase shift, the in-phase samples are inverted to produce samples $\bar{S}_I$ to $\bar{S}_{I15}$ from samples $S_{I1}$ to $S_{I15}$, respectively, and these samples $\bar{S}_I$ to $\bar{S}_{I15}$ follow sequentially samples $S_{I1}$ to $S_{I15}$ to recycle a phasor $S\angle 0°$ followed sequentially by phasor $S\angle -180°$ in the in-phase channel while the out-of-phase samples $S_{Q1}$ to $S_{Q15}$ are inverted to produce samples $\bar{S}_{Q1}$ to $\bar{S}_{Q15}$ from samples $S_{Q1}$ to $S_{Q15}$, respectively, and these samples $\bar{S}_{Q1}$ to $\bar{S}_{Q15}$ follow sequentially samples $S_{Q1}$ to $S_{Q15}$ to recycle a phasor $S\angle -90°$ followed by a phasor $S\angle -270°$ in the quadrature channel so that the in-phase channel in effect recycles a "double segment" made up of samples $S_{I1}$ to $S_{I15}$ followed by $\bar{S}_{I1}$ to $\bar{S}_{I15}$ (i.e. phasor $S\angle 0°$ followed by phasor $S\angle -180°$) and the quadrature channel in effect recycles a "double segment" made up of samples $S_{Q1}$ to $S_{Q15}$ followed by samples $\bar{S}_{Q1}$ to $\bar{S}_{Q15}$ (i.e. phasor $S\angle -90°$ followed by $S\angle -270°$). Thus, both channels recycle a composite phasor made up of samples of the initially stored signal followed by samples of such initially stored signal phase delayed 180 degrees; in the case of the in-phase channel, the initially stored signal is sequentially phasor $S\angle 0°$ and in the case of the quadrature channel, the initially stored signal is represented by the phasor $S\angle -90°$. To provide the required 90° phase shift in the in-phase channel, the quadrature samples $S_{Q1}$ to $S_{Q15}$ follow, sequentially, samples $S_{I1}$ to $S_{I15}$ of the in-phase samples, the samples $\bar{S}_{I1}$ to $\bar{S}_{I15}$ follow samples $S_{Q1}$ to $S_{Q15}$ and the samples $\bar{S}_{Q1}$ to $\bar{S}_{Q15}$ follow follow samples $\bar{S}_{I1}$ to $\bar{S}_{I15}$ to produce a recycling "quadruple segment" made up of samples $S_{I1}$ to $S_{I15}$ followed by samples $S_{Q1}$ to $S_{Q15}$ followed by samples $\bar{S}_{I1}$ to $\bar{S}_{I15}$ followed by samples $\bar{S}_{Q1}$ to $\bar{S}_{Q15}$ which "quadruple segment" recycles in the in-phase channel and, in the quadrature channel, samples $\bar{S}_{I1}$ to $\bar{S}_{I15}$ follow samples $S_{Q1}$ to $S_{Q15}$, samples $\bar{S}_{Q1}$ to $\bar{S}_{Q15}$ follow samples $\bar{S}_{I1}$ to $\bar{S}_{I15}$ and samples $S_{I1}$ to $S_{I15}$ follow samples $\bar{S}_{Q1}$ to $\bar{S}_{Q15}$ to produce a recycling "quadruple segment" in the quadrature channel made up of samples $S_{Q1}$ to $S_{Q15}$ followed by samples $\bar{S}_{I1}$ to $\bar{S}_{I15}$, followed by samples $\bar{S}_{Q1}$ to $\bar{S}_{Q15}$ followed by samples $S_{I1}$ to $S_{I15}$. That is, a composite phasor made up of phase $S\angle 0°$ followed sequentially by phasor $S\angle -90°$ followed by phasor $S\angle -180°$ followed by phasor $S\angle -270°$ is formed and such composite phasor recycles in the in-phase channel while a composite phasor made up of phasor $S\angle -90°$ followed by phasor $S\angle -180°$ followed by phasor $S\angle -270°$ followed by phasor $S\angle 0°$ is formed and such composite phasor recycles in the quadrature channel. Thus, to provide the composite phasor in either one of the channels, the initially stored signal (i.e. represented by phasor $S\angle 0°$ in the in-phase channel and represented by phasor $S\angle -90°$ in the quadrature channel) has following it a segment of samples of a signal which is delayed 90 degrees with respect to the prior sampled signal in the sequence. A 270° phase shift is provided by forming a "quadruple segment" of samples made up of samples $S_{I1}$ to $S_{I15}$ followed by samples $\bar{S}_{Q1}$ to $\bar{S}_{Q15}$ followed by samples $\bar{S}_{I1}$ to to $\bar{S}_{I15}$ followed by samples $S_{Q1}$ to $S_{Q15}$ and recycling such "quadruple segment" in the in-phase channel and by forming and recycling in the quadrature channel a "quadruple segment" made up of samples $S_{Q1}$ to $S_{Q15}$, followed by samples $\bar{S}_{I1}$ to $\bar{S}_{I15}$ followed by samples $\bar{S}_{Q1}$ to $\bar{S}_{Q15}$ followed by samples $\bar{S}_{I1}$ to $\bar{S}_{I15}$. That is, a composite phasor is provided to recycle in the in-phase channel and quadrature channel, the first phasor being the intially stored samples (represented by phasor $S\angle 0°$ and $S\angle -90°$, respectively) and each sequentially stored phasor representing samples of a signal delayed 270° with respect to the prior sampled signal. As will be described hereinafter, the signals recirculating in the in-phase and quadrature channels are combined to form a composite signal which, after frequency upconversion, provides a continuous wave signal having the same frequency of the received pulse and relatively small periodic phase discontinuities.

Referring again to FIG. 1, as noted above, the intermediate frequency signals produced by low pass filters 17, 19 are fed to limiters 25, 27, respectively, as shown. The limiters 25, 27 convert the sinusoidal signals 21, 23 into a train of pulses 26, 28 (FIGS. 2C, 2D), respectively, having a "high" or logical 1 state when the sinusoidal signals 21, 23 are of positive polarity and a "low" or logical 0 state when such sinusoidal signals are of a negative polarity, as indicated.

The output of limiter 25 is fed to input 34 of selector 38, as shown, and the output of limiter 27 is fed to the input 35 of a selector 39, as shown. A three bit control signal is fed to terminals $C_0$, $C_1$, $C_2$ of selectors 38, 39, as shown. Each one of the selectors 38, 39 has four additional inputs $IN_0$, $IN_1$, $IN_2$ and $IN_3$, as shown. One of the four inputs of the selectors 38, 39 is electrically coupled to the outputs thereof selectively in response to the three bit control signals fed to terminals $C_0$, $C_1$, $C_2$, as shown below:

| $C_0$, | $C_1$, | $C_2$ | SELECTOR 38 OUTPUT | SELECTOR 39 OUTPUT |
|---|---|---|---|---|
| 0 | DC | DC | Terminal 34 | Terminal 35 |
| 1 | 0 | 0 | Terminal $IN_0$ | Terminal $IN_0$ |
| 1 | 0 | 1 | Terminal $IN_1$ | Terminal $IN_1$ |
| 1 | 1 | 0 | Terminal $IN_2$ | Terminal $IN_2$ |
| 1 | 1 | 1 | Terminal $IN_3$ | Terminal $IN_3$ | where "DC" is "DON'T CARE."

Figure 2D:
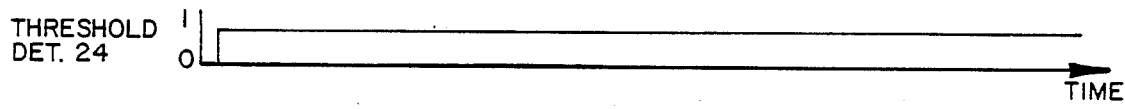
Figure 2E:
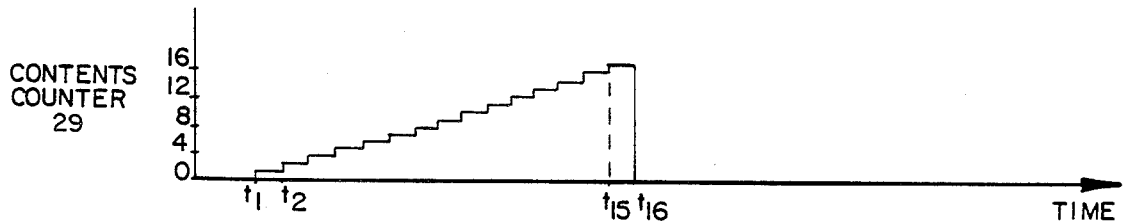
Figure 2F:
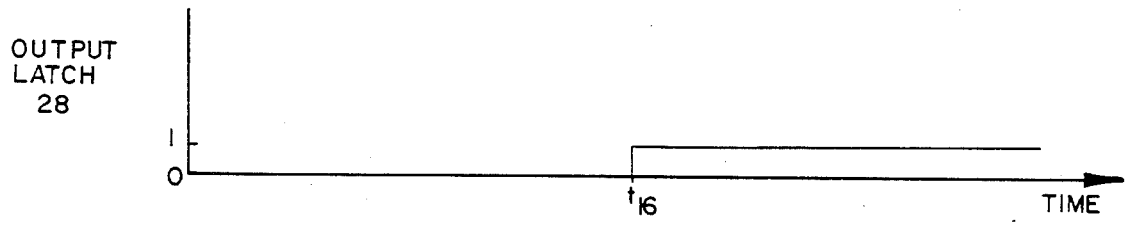

It is noted that when the control signal on line $C_0$ is logical 0, the signals produced at the outputs of limiters 25, 27 are fed through the selectors 38, 39 to the first, or input, stages of conventional shift register memories 40, 42, respectively, as indicated, independent of the signals on control terminals $C_1$, $C_2$. Thus, the signals produced at the output of limiters 25, 27 are converted into one bit samples and such samples are sequentially stored in the shift registers 40, 42. In response to a detected radio frequency pulse, the output of threshold detector 24 goes high, as shown in FIG. 2D and the contents of counter 29 increment by one in response to each clock pulse fed thereto as shown in FIG. 2E. After 16 samples have been stored in each one of the shift registers 40, 42, the overflow terminal OV of counter 29 goes high and the output of latch 28 changes from a logical 0 state to a logical 1 state as shown in FIG. 2F. Here such shift registers 40, 42 have 16 serially coupled storage stages, the first and last one (i.e. stage 16) being coupled to a logic section 43, as shown. The next to the last stage of shift register 40 (i.e. stage 15) is coupled directly to both input terminal $IN_0$ of selector 38 and input terminal $IN_1$ of selector 39 and while such next to the last stage, (i.e. stage 15), of shift register 40 is coupled, after passing through inverter 44, to both input terminal $IN_3$ of selector 38 and input terminal $IN_2$ of selector 39, as shown. The first and last stages of shift register 42 are coupled to logic section 43. The next to the last stage (i.e. stage 15) of such shift register 42 is coupled directly to both the input $IN_2$ of selector 38 and the input $IN_0$ of selector 39, as shown, while such next to the last stage of shift register 42 is coupled, after passing through an inverter 46, to both the input terminal $IN_1$ of selector 38 and input terminal $IN_3$ of selector 39, as shown. Thus, the signals produced by limiters 25, 27 are initially fed to the first stages of shift registers 40, 42. In response to clock pulses fed thereto via line c.p. one bit samples of such fed signals are sequentially stored in the shift registers 40, 42. After 16 samples have been stored subsequent to detection of a received radio frequency pulse by detector 24 the contents of counter 29 overflow and the signal then produced at the OV terminal thereof changes the output of latch 28 from a logical 0 state to a logical 1 state as noted above. Hence, the signal at terminal $C_0$ changes from a logical 0 to a logical 1. Further, the logical 1 output of latch 28 is fed to the enable terminals of registers 50, 52, 54, 56 and in response to such enable signal registers 50, 52, 54, 56 store therein samples $S_{I1}$, $S_{I16}$, $S_{Q1}$, $S_{Q16}$, respectively. Further, if the signal produced at the output of the next to the last stage (i.e. stage 15) of shift register 40 is I and the output of the next to the last output stage, i.e., stage 15, of shift register 42 is designated as Q, the signals at input terminals $IN_0$, $IN_1$, $IN_2$, $IN_3$ of selector 38 are I, $\overline{Q}$, Q and $\overline{I}$, respectively, and the signals of the input terminals $IN_0$, $IN_1$, $IN_2$, $IN_3$ of selector 39 are Q, I, $\overline{I}$ and $\overline{Q}$, respectively.

Logic section 43 includes the four registers 50, 52, 54, 56 coupled to the first and last stages of registers 40, 42, as shown. As noted above, the contents stored in such registers 50 to 56 are initially reset to zero and such registers store the signals fed thereto in response to the enable signal fed to the enable terminal EN thereof by latch 28 on line 58. The outputs of registers 50, 52 are fed to an EXCLUSIVE-OR gate 60 and the outputs of registers 54, 56 are fed to an EXCLUSIVE-OR gate 62, as shown. The output of EXCLUSIVE-OR gate 60 is fed to the $C_1$ terminal of selectors 38, 39 and the output of EXCLUSIVE-OR gate 62 is fed to the $C_2$ terminal of selectors 38, 39, as shown. Thus, if the signals produced in stages 1 and 16 (i.e. the first and last stages) of register 40 are designated $S_{I1}$ and $S_{I16}$, respectively, and the signals stored in the first and last stages of register 42 are designated as $S_{Q1}$, $S_{Q16}$, respectively, the logical signals at terminals $C_1$, $C_2$ may be represented as:

| $S_{I1}$ | $S_{I16}$ | $C_1$ | $S_{Q1}$ | $S_{Q16}$ | $C_2$ |
|---|---|---|---|---|---|
| 0 | 0 | 0 | 0 | 0 | 0 |
| 0 | 1 | 1 | 0 | 1 | 1 |
| 1 | 0 | 1 | 1 | 0 | 1 |
| 1 | 1 | 0 | 1 | 1 | 0 |

Thus, if the samples stored in the first and last stages of shift register 40 are the same, (i.e. $S_{I1}=S_{I16}$), a logical 0 signal is produced at terminal $C_1$, whereas if such samples are different, (i.e. $S_{I1}\neq S_{I16}$), a logical 1 signal is produced at terminal $C_1$. Likewise, if the logical samples stored in the first and last stages of register 42 are the same, (i.e. $S_{Q1}=S_{Q16}$), a logical 0 is produced on line $C_2$, whereas if such samples are different, (i.e. $S_{Q1}\neq S_{Q16}$), a logical 1 is produced on line $C_2$. It follows, then, that if the first and last bits of the data stored in register 40 are equal, i.e. $S_{I1}=S_{I16}$ and the first and last bits of the data stored in register 42 are equal, i.e., $S_{Q1}=S_{Q16}$ no phase shift is required in the recirculation process and $C_1=0$ and $C_2=0$ so that the output of stage 15 of register 40 is fed to the input stage thereof and the output of stage 15 of register 42 is fed to the input stage thereof. Thus, shift register 40 recycles a single segment made up of samples $S_{I1}$ to $S_{I16}$ (i.e. represented by phasor $S\angle 0°$) and shift register 42 recycles a single segment made up of samples $S_{Q1}$ to $S_{Q15}$ (i.e. represented by phasor $S\angle -90°$). If, however, sample $S_{I1}$ is equal to sample $S_{I16}$, but sample $S_{Q1}$ is not equal to sample $S_{Q16}$, the control signal on terminal $C_1$ is 0 but the control signal on terminal $C_2$ is 1 so that the output of inverter 46 is fed through selector 38 to the input of the first stage of shift register 40 and the output of stage 15 of shift register 40 is coupled through selector 39 to the input of the first stage of shift register 42. Thus, shift register 40 recycles a "quadruple segment" made up of a segment of samples $S_{I1}$ to $S_{I15}$ followed by a segment made up of samples $\bar{S}_{Q1}$ to $\bar{S}_{Q15}$ followed by a segmnt of samples $\bar{S}_{I1}$ to e,ovs/S/ $_{I15}$ followed by a segment of samples $S_{Q1}$ to $S_{Q15}$ (i.e. a composite segment made up of phasor $S\angle 0°$ followed by phasor $S\angle -270°$ followed by phasor $S\angle -180°$ followed by phasor $S\angle -90°$; it being noted that each succeeding phasor has a 270 degree phase delay relative to the prior phasor) and shift register 42 recycles a "quadruple segment" made up of a segment of samples $S_{Q1}$ to $S_{Q15}$ followed by a segment of samples $S_{I1}$ to $S_{I16}$ followed by a segment of samples $\bar{S}_{Q1}$ to $\bar{S}_{Q15}$ followed by a segment of of samples $\bar{S}_{I1}$ to $\bar{S}_{I15}$ (i.e. a composite signal made up of phasor $S\angle -90°$, followed by phasor $S\angle 0°$ followed by phasor $S\angle -270°$ followed by phasor $S\angle -180°$; it being noted that each succeeding phasor has a 270 degree phase delay relative to the prior phasor) to thereby provide a 270 degree phase shift in the recirculating signals. If, on the other hand, sample $S_{I1}$ does not equal sample $S_{I16}$ but sample $S_{Q1}$ does equal sample $S_{Q16}$, the signal on control terminal $C_1$ is 1 and the signal on control terminal $C_2$ is 0 so that the output of stage 15 of shift register 42 is coupled through selector 38 to the input of the first stage of shift register 40, while the output of inverter 44 is coupled through selector 39 to the input of the first stage of shift register 42. Thus, shift register 40 recycles a "quadruple segment" made up of a segment of samples $S_{I1}$ to $S_{I15}$ followed by a segment of samples $S_{Q1}$ to $S_{Q15}$ followed by a segment of samples $\bar{S}_{I1}$ to $\bar{S}_{I15}$ followed by a a segment of samples $\bar{S}_{Q1}$ to $\bar{S}_{Q15}$ (i.e. a composite segment made up of phasor $S\angle 0°$ followed by phasor $S\angle -90°$ followed by phasor $S\angle -180°$ followed by phasor $S\angle -270°$; it being noted that each succeeding phasor has a 90 degree phase delay relative to the prior phasor) while shift register 42 recycles a "quadruple segment" of samples made up of a segment of samples $S_{Q1}$ to $S_{Q15}$ followed by a segment of samples $\bar{S}_{I1}$ to $\bar{S}_{I15}$ followed by a segment of samples $\bar{S}_{Q1}$ to $\bar{S}_{Q15}$ followed by a a segment of samples $S_{I1}$ to $S_{I15}$ (i.e. a composite phasor made up of phasor $S\angle -90°$ followed by phasor $S\angle -180°$ followed by phasor $S\angle -270°$ followed by phasor $S\angle 0°$; it being noted that each succeeding phasor has a 90 degree phase delay relative to the prior phasor) to thereby provide a 90 degrees shift in the recycling samples. Lastly, if sample $S_{I1}$ does not equal sample $S_{I16}$, and if sample $S_{Q1}$ does not equal sample $S_{Q16}$, the signal on terminal $C_1$ is 1 and the signal on terminal $C_2$ is 1 so that the output of inverter 44 passes through selector 38 to the input of the first stage of shift register 40 and the output of inverter 46 passes through selector 39 to the input of the first stage of shift register 42. Thus, shift register 40 recycles a "double segment" of a segment of samples $S_{I1}$ to $S_{I15}$ followed by a segment of samples $\bar{S}_{I1}$ to $\bar{S}_{I15}$ (i.e. a composite phasor made up of $S\angle 0°$ followed by phasor $S\angle -180°$; it being noted that the later phasor has a 180 degree phase delay relative to the former phasor) while shift register 42 recycles a "double segment" made up of a segment of samples $S_{Q1}$ to $S_{Q15}$ followed by a segment of samples $\bar{S}_{Q1}$ to $\bar{S}_{Q15}$ (i.e. a composite phasor made up of phasor $S\angle -90°$ followed by phasor $S\angle -270°$; it being noted that the later phasor is delayed relative to the former phasor) to thereby provide a 180 degree phase shift in the recirculating processes. The outputs of the stages 15 of shift registers 40, 42 are fed to AND gates 70, 72, as shown. Also fed to such AND gates is the output of latch 28 so that, during the recirculation process, the samples sequentially produced in stages 15 pass through such AND gate to low pass filters 74, 76, respectively, as indicated. Low pass filters 74, 76 are identical to low pass filters 17, 19 so that the signals passing through such filters have the same frequency as the intermediate frequently signals passing through filters 17, 19. The signal passing through filters 74, 76 are up-converted in frequency by mixers 78, 80, which mixers 78, 80 are fed to the local oscillator signal produced by local oscillator 13. The up-converted signal produced by mixer 78 is fed to the quadrature input port of a quadrature hybrid 82, while the up-converted signal produced by mixer 80 is fed to the in-phase input of the quadrature hybrid 82 to combine the in-phase and quadrature channels and produce a composite radio frequency signal having the same frequency as the received pulse. The composite signal is amplified in a conventional traveling wave tube (TWT) amplifier 90 and transmitted through conventional antenna 92. After the received pulse has terminated and a desired number of cycles of the continuous wave signal have been transmitted, the recycling of the samples in the shift registers 40, 42 stops by resetting the output of latch 28 and the contents of counter 29 via a reset signal produced by any convenient means, (as an operator) not shown, on line RESET.

Having described a preferred embodiment of the invention, it is now evident that other embodiments incorporating these concepts may be used. For example, while sixteen stage shift registers have been shown, such registers may have more, or less than, sixteen stages. Further, instead of using shift registers, random access memories may be used. Further, while quadrature channel processing has been shown for recirculation, a single channel, one bit sampling system may be used where it is only required to provide a correction, or step phase change, if either zero degrees or one hundred and eighty degrees. Further, the fineness of correction may be increased in either a single or a multiple channel system by either using more channels phase shifted with respect to each other or by taking more bits or levels per sample or a combination of both. While these extensions add hardware, they all retain the following operational advantages: the use of a recorded segment length independent of the signal frequency which may be selected in advance of signal recording; recirculation of all but one sample of the signal recorded, thus making maximum use of limited recording time; and operational effectiveness from d.c. to, and including, the Nyquist limit for the sampling rate selected. It is further noted that while limiters 25, 27 have been included, such limiters are not necessary since the sampling-storing action of the shift systems 40, 42 act as limiters inherently. Further, if more than one bit sampling is used the limiters would be undesirable. Still further, while a quadrature system is described, a 180 degree correction system is possible using a single channel system. It is felt, therefore, that this invention should not be restricted to the disclosed embodiment, but rather should be limited only by the spirit and scope of the appended claims.

What is claimed is:

1. Apparatus comprising:
   means for storing first and last samples of a recorded segment of a periodic signal;

means, responsive to the stored first and last samples, for producing a control signal indicative of the difference between the first and last samples; and means, responsive to the control signal, for sequentially reading from the storing means a portion of the recorded segment, each sequentially read portion of the recorded segment having a phase shift relative to the phase shift of a preceding sequentially read segment related to the difference between the stored first and last samples, producing an output signal for a time duration greater than the recorded segment of the periodic signal and having the same frequency as the frequency of the periodic signal.

2. Apparatus comprising:
(a) means for storing a predetermined plurality of samples of a signal;
(b) means, responsive to a first and last one of the stored samples for comparing such first and last stored samples to provide a control signal representative of such comparison; and
(c) means for producing a sequence of samples of a portion of the plurality of stored samples, each succeeding segment in the sequence being samples of the signal delayed in phase from the preceding samples an amount indicated by the control signal, producing an output signal for a time duration greater than the signal and having the same frequency as the frequency of the signal.

3. Apparatus comprising:
(a) means for storing a predetermined segment of a periodic signal;
(b) means for producing the stored periodic signal and at least one phase delayed replica of such stored periodic signal;
(c) means, responsive to first and last samples of the predetermined segment for producing a control signal indicative of the relative phase shift between the first annd last samples; and
(d) means for producing a sequence of either a portion of the predetermined segment of the stored signal or a sequence of the portion of the predetermined segment of the stored signal followed by at least one phase delayed replica of such stored periodic signal, selectively in accordance with the control signal, producing an output signal for a time duration greater than the stored segment of the periodic signal and having the same frequency as the frequency of the periodic signal.

4. Apparatus comprising:
(a) a plurality of signal channels, each one thereof having means for storing a predetermined portion of a periodic signal, the stored signals in the channels having a predetermined relative phase shift therebetween;
(b) means for producing a control signal representative of the phase shift being a first portion and last portion of the predetermined portion of the stored periodic signal; and
(c) means, responsive to the control signal, for sequentially coupling the segments of the signals stored in the plurality of signal channels, the sequence of sample being selectively coupled in accordance with the control signal, producing an output signal for a time duration greater than each of the stored segments of the periodic signal and having the same frequency as the frequency of the periodic signal.

* * * * *

UNITED STATES PATENT OFFICE
CERTIFICATE OF CORRECTION

Patent No. 4,493,090           Dated January 8, 1985

Inventor(s) Bruce E. Gordon

It is certified that error appears in the above-identified patent and that said Letters Patent are hereby corrected as shown below:

Column 7, Line 7:    Change "segmnt" to --segment--;

Column 7, Line 8:    Change "e,ovs/S/ $I_{15}$" to --$S_{I15}$--;

Column 8, Line 10:    Change "frequently" to --frequency--;

and,

Claim 4, Column 10, Line 31:    Change "sample" to --samples--.

Signed and Sealed this

Thirteenth Day of August 1985

[SEAL]

Attest:

DONALD J. QUIGG

Attesting Officer      Acting Commissioner of Patents and Trademarks